US012684977B2

(12) United States Patent
Liu et al.

(10) Patent No.: US 12,684,977 B2
(45) Date of Patent: Jul. 14, 2026

(54) ARRAY SUBSTRATE, DISPLAY PANEL AND DISPLAY DEVICE

(71) Applicant: BOE TECHNOLOGY GROUP CO., LTD., Beijing (CN)

(72) Inventors: Dongni Liu, Beijing (CN); Qi Qi, Beijing (CN); Feng Qu, Beijing (CN); Minghua Xuan, Beijing (CN); Haoliang Zheng, Beijing (CN); Jiao Zhao, Beijing (CN)

(73) Assignee: BOE TECHNOLOGY GROUP CO. , LTD., Beijing (CN)

( * ) Notice: Subject to any disclaimer, the term of this patent is extended or adjusted under 35 U.S.C. 154(b) by 0 days.

(21) Appl. No.: 18/603,918

(22) Filed: Mar. 13, 2024

(65) Prior Publication Data

US 2024/0215362 A1 Jun. 27, 2024

Related U.S. Application Data

(63) Continuation-in-part of application No. 17/615,514, filed as application No. PCT/CN2021/072161 on Jan. 15, 2021, now Pat. No. 11,955,075.

(30) Foreign Application Priority Data

Jan. 16, 2020 (CN) .......................... 202010049497.1

(51) Int. Cl.
*G09G 3/3233* (2016.01)
*H10K 59/131* (2023.01)

(52) U.S. Cl.
CPC ......... *H10K 59/131* (2023.02); *G09G 3/3233* (2013.01); *G09G 2320/0223* (2013.01); *G09G 2320/0233* (2013.01); *G09G 2330/02* (2013.01)

(58) Field of Classification Search
CPC .......... G09F 9/33; G09G 3/32; G09G 3/3233; G09G 2300/0426; G09G 2320/023;
(Continued)

(56) References Cited

U.S. PATENT DOCUMENTS

2007/0002243 A1 1/2007 Kim
2009/0184899 A1 7/2009 Kim et al.
(Continued)

FOREIGN PATENT DOCUMENTS

CN 101488518 A 7/2009
CN 103778884 A 5/2014
(Continued)

OTHER PUBLICATIONS

First Office Action on the Chinese Patent Application No. 202010049497.1 issued by the Chinese Patent Office on Mar. 28, 2022.
(Continued)

*Primary Examiner* — Stacy Khoo
(74) *Attorney, Agent, or Firm* — XSENSUS LLP

(57) ABSTRACT

An array substrate has a display area and a non-display area including a first bonding region and a fan-out region located between the display area and the first bonding region. The array substrate includes: a plurality of pixel columns disposed in the display area, at least two first power supply input terminals disposed in the first bonding region, and at least two first fan-out structures disposed in the fan-out region. Each pixel column includes light-emitting units. Each first power supply input terminal is connected to multiple pixel columns of the plurality of pixel columns through one first fan-out structure, so as to provide a first power supply signal to the multiple pixel columns. Each first fan-out structure includes a plurality of first conductive
(Continued)

units, and each first conductive unit is electrically connected to at least one of the plurality of pixel columns.

18 Claims, 12 Drawing Sheets

(58) Field of Classification Search
CPC ....... H01L 27/12; H01L 27/124; H01L 27/15; H01L 27/156; H10K 59/131
See application file for complete search history.

(56) References Cited

U.S. PATENT DOCUMENTS

| | | | | |
|---|---|---|---|---|
| 2013/0335123 | A1* | 12/2013 | Choi | H03K 17/165 |
| | | | | 156/60 |
| 2014/0111116 | A1 | 4/2014 | Shin et al. | |
| 2014/0117314 | A1 | 5/2014 | Jeong et al. | |
| 2014/0139413 | A1 | 5/2014 | Kwon et al. | |
| 2014/0152636 | A1 | 6/2014 | Yamada | |
| 2018/0342569 | A1 | 11/2018 | Chen et al. | |
| 2019/0244974 | A1 | 8/2019 | Chen | |
| 2019/0304388 | A1* | 10/2019 | Chen | G02F 1/136286 |
| 2020/0006452 | A1* | 1/2020 | Lee | H10K 59/1213 |
| 2020/0219453 | A1 | 7/2020 | Park et al. | |
| 2020/0286426 | A1 | 9/2020 | Li et al. | |
| 2021/0013289 | A1 | 1/2021 | Li et al. | |
| 2021/0151544 | A1 | 5/2021 | Kim et al. | |

FOREIGN PATENT DOCUMENTS

| | | | | |
|---|---|---|---|---|
| CN | 103811519 | A | | 5/2014 |
| CN | 103839516 | A | | 6/2014 |
| CN | 105761675 | A | * | 7/2016 |
| CN | 107195660 | A | | 9/2017 |
| CN | 108241240 | A | | 7/2018 |
| CN | 109686312 | A | | 4/2019 |
| CN | 110310976 | A | | 10/2019 |
| CN | 110518048 | A | | 11/2019 |
| JP | 2006084503 | A | | 3/2006 |

OTHER PUBLICATIONS

Office Action on the U.S. Appl. No. 17/615,514 issued by the USPTO on Aug. 16, 2023.
Notice of Allowance for the U.S. Appl. No. 17/615,514 issued by the USPTO on Dec. 6, 2023.
International Search Report and Written Opinion on the International Patent Application No. PCT/CN2021/072161 issued by the International Searching Authority on Apr. 15, 2021.

* cited by examiner

ARRAY SUBSTRATE, DISPLAY PANEL AND DISPLAY DEVICE

CROSS-REFERENCE TO RELATED APPLICATIONS

This application is a continuation-in-part of U.S. patent application Ser. No. 17/615,514, filed on Nov. 30, 2021, which claims priority to International Patent Application No. PCT/CN2021/072161, filed on Jan. 15, 2021, which in turn claims priority to Chinese Patent Application No. 202010049497.1, filed on Jan. 16, 2020, which are incorporated herein by reference in their entirety.

TECHNICAL FIELD

The present disclosure relates to the field of display technologies, and in particular, to an array substrate, a display panel and a display device.

BACKGROUND

For a display panel, an IR drop (a voltage drop) on an anode line or a cathode line will cause uneven brightness. Generally, a horizontal IR drop is much greater than a vertical IR drop. Therefore, how to solve a problem of the horizontal IR drop in the display panel is very important to improve the uniformity of the brightness of the display panel.

SUMMARY

In a first aspect, an array substrate is provided. The array substrate has a display area and a non-display area. The non-display area includes a first bonding region and a fan-out region located between the display area and the first bonding region. The array substrate includes a plurality of pixel columns disposed in the display area, at least two first power supply input terminals disposed in the first bonding region, and at least two first fan-out structures disposed in the fan-out region. Each of the plurality of pixel columns includes a plurality of light-emitting units. Each first power supply input terminal is connected to multiple pixel columns of the plurality of pixel columns through one first fan-out structure, so as to provide a first power supply signal to the multiple pixel columns. Each first fan-out structure includes a plurality of first conductive units, and each first conductive unit is electrically connected to at least one of the plurality of pixel columns.

In some embodiments, the plurality of first conductive units are parallel to each other.

In some embodiments, the plurality of first conductive units of each first fan-out structure are independently electrically connected to a corresponding first power supply input terminal.

In some embodiments, resistances of the plurality of first conductive units are substantially equal.

In some embodiments, the array substrate further includes at least one second power supply input terminal disposed in the first bonding region. Each second power supply input terminal is electrically connected to at least one pixel column of the plurality of pixel columns, so as to provide a second power supply signal to the at least one pixel column connected to the second power supply input terminal.

In some embodiments, the array substrate further includes at least one second fan-out structure disposed in the fan-out region; each second power supply input terminal is electrically connected to multiple pixel columns of the plurality of pixel columns through one second fan-out structure. Each second fan-out structure includes a plurality of second conductive units, and each second conductive unit is electrically connected to at least one of the plurality of pixel columns.

In some embodiments, each first conductive unit is electrically connected to one pixel column, and each second conductive unit is electrically connected to one pixel column.

In some embodiments, the plurality of second conductive units are parallel to each other; and/or resistances of the plurality of second conductive units are substantially equal; and/or the plurality of second conductive units of each second fan-out structure are independently electrically connected to a corresponding second power supply input terminal.

In some embodiments, the at least two first power supply input terminals and the at least one second power supply input terminal are alternately arranged in a first direction, the first direction being perpendicular to an extending direction of the pixel column.

In some embodiments, the first bonding region includes a first bonding sub-region and a second bonding sub-region arranged in a first direction, the first direction being perpendicular to an extending direction of the pixel column. The at least two first power supply input terminals are divided into two sets of first power supply input terminals, each set of first power supply input terminals includes two or more first power supply input terminals, and the two sets of first power supply input terminals are located in the first bonding sub-region and the second bonding sub-region, respectively. The at least one second power supply input terminal includes a plurality of second power supply input terminals that are divided into two sets of second power supply input terminals, each set of second power supply input terminals includes two or more second power supply input terminals, and the two sets of second power supply input terminals are located in the first bonding sub-region and the second bonding sub-region, respectively.

In some embodiments, first power supply input terminals and second power supply input terminals located in the first bonding sub-region as a whole is mirrored symmetrically with first power supply input terminals and second power supply input terminals located in the second bonding sub-region as a whole.

In some embodiments, the first power supply input terminals and second power supply input terminals located in the first bonding sub-region are alternately arranged in the first direction.

In some embodiments, for part of first power supply input terminals located in the first bonding sub-region, at least two second power supply input terminals are disposed between two adjacent first power supply input terminals.

In some embodiments, first power supply input terminals located in the first bonding sub-region are adjacent to each other, and second power supply input terminals located in the first bonding sub-region are separated by the first power input terminals.

In some embodiments, the plurality of light-emitting units each include a first electrode. The array substrate further includes pixel circuits arranged in an array, and each pixel circuit is electrically connected to a first electrode of a corresponding light-emitting unit, and is configured to provide a driving signal to the corresponding light-emitting unit. Each first power supply input terminal is electrically connected to pixel circuits that are electrically connected to light-emitting units included in the multiple pixel columns of the plurality of pixel columns, so as to provide the first power supply signal to the pixel circuits that are electrically connected to the first power supply input terminal. In some embodiments, the light-emitting unit further includes a second electrode. The array substrate further includes at least one second power supply input terminal disposed in the first bonding region, each second power supply input terminal is electrically connected to second electrodes of light-emitting units included in at least one pixel column of the plurality of pixel columns, so as to provide a second power supply signal to the second electrodes of the light-emitting units included in the at least one pixel column of the plurality of pixel columns.

In some embodiments, the non-display area further includes a second bonding region located on a side of the display area away from the first bonding region. The array substrate further includes a plurality of data signal input terminals located in the second bonding region, and the plurality of data signal input terminals are configured to provide data signals to light-emitting units.

In a second aspect, a display panel is provided. The display panel includes the array substrate as described in any one of the above embodiments.

In a third aspect, a display device is provided. The display device includes the display panel as described above.

In some embodiments, the non-display area of the array substrate includes the first bonding region and a second bonding region, the second bonding region is located on a side of the display area away from the first bonding region. The display device further includes a first external driving circuit bonded to the first bonding region and a second external driving circuit bonded to the second bonding region.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings to be described below may be regarded as schematic diagrams, and are not limitations on actual sizes of products, actual processes of methods and actual timings of signals involved in the embodiments of the present disclosure.

DETAILED DESCRIPTION

Figure 1:
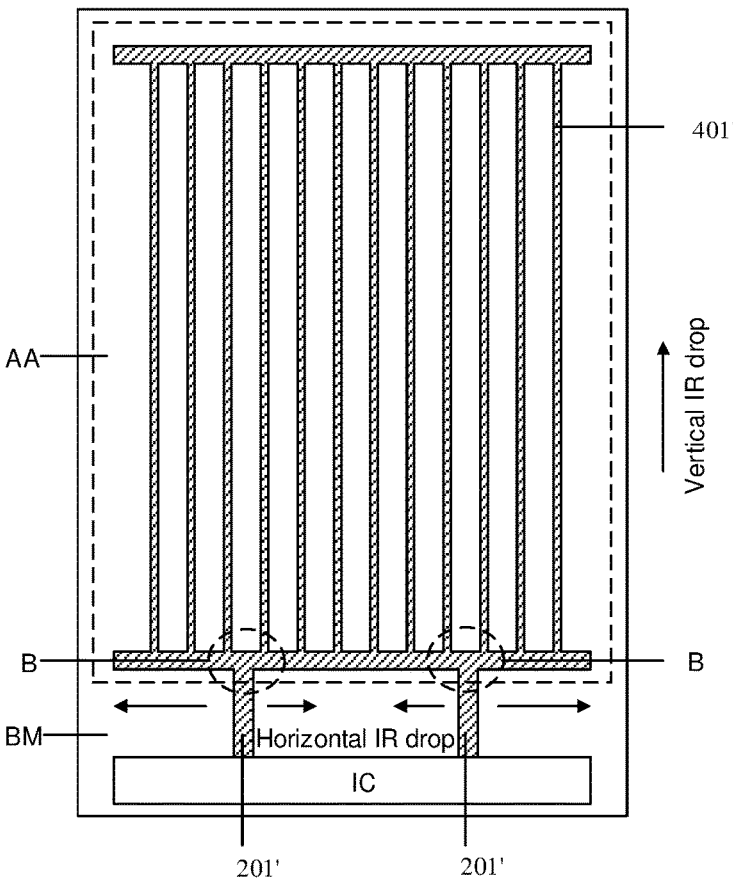
FIG. 1 is a schematic top view showing a structure of an organic light-emitting diode (OLED) display panel in the related art.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art on the basis of the embodiments of the present disclosure shall be included in the protection scope of the present disclosure.

Unless the context requires otherwise, throughout the specification and the claims, the term "comprise" and other forms thereof such as the third-person singular form "comprises" and the present participle form "comprising" are construed as an open and inclusive meaning, i.e., "including, but not limited to". In the description of the specification, terms such as "one embodiment", "some embodiments", "exemplary embodiments", "an example", "a specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment or example. In addition, the specific features, structures, materials, or characteristics may be included in any one or more embodiments or examples in any suitable manner.

Hereinafter, terms such as "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

Those skilled in the art may understand that, the singular forms "a", "an", "said" and "the" used herein may further include plural forms unless specifically specified. It will be further understood that, the term "include/includes/including" used in the specification of the present disclosure refers to that the features, integers, steps, operations, elements and/or components are present, but it does not exclude that one or more other features, integers, steps, operations, elements, components and/or their groups are present or added.

In the description of some embodiments, the terms "coupled" and "connected" and their derivatives may be used. For example, the term "connected" may be used in the description of some embodiments to indicate that two or more components are in direct physical contact or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

The phrase "at least one of A, B and C" has the same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The use of the phrase "applicable to" or "configured to" herein means an open and inclusive expression, which does not exclude devices that are applicable to or configured to perform additional tasks or steps.

As used herein, the term "substantially" includes a stated value and an average value within an acceptable range of deviation of a particular value. The acceptable range of deviation is determined by a person of ordinary skill in the art in view of the measurement in question and errors associated with the measurement of a particular quantity (i.e., the limitation of the measurement system).

Those skilled in the art may understand that, unless otherwise defined, all terms (including technical terms and scientific terms) used herein have the same meanings as commonly understood by those of ordinary skill in the art to which the present disclosure belongs. It will also be understood that, terms such as those defined in general dictionaries should be understood as having meanings consistent with the meanings in the context of the prior art, and unless specifically defined as herein, they will not be interpreted with idealized or overly formal meanings.

Exemplary embodiments are described herein with reference to sectional views and/or plan views as idealized exemplary drawings. In the accompanying drawings, thicknesses of layers and sizes of regions may be enlarged for clarity. Variations in shape with respect to the drawings due to, for example, manufacturing technologies and/or tolerances may be conceivable. Therefore, the exemplary embodiments should not be construed as being limited to the shapes of the regions shown herein, but including shape deviations due to, for example, manufacturing. For example, an etched region shown in a rectangular shape generally has a curved feature. Therefore, the regions shown in the accompanying drawings are schematic in nature, and their shapes are not intended to show actual shapes of the region in a device, and are not intended to limit the scope of the exemplary embodiments.

Embodiments of the present disclosure are described below in detail. Examples of the embodiments of the present disclosure are shown in the accompanying drawings, in which same or similar reference signs consistently indicate same or similar components or components with same or similar functions. In addition, if a detailed description of the known technology is unnecessary for the illustrated features of the embodiments of the present disclosure, it will be omitted. The embodiments to be described below with reference to the accompanying drawings are exemplary, and are only used to explain the present disclosure, and cannot be construed as limitations on the present disclosure.

Some embodiments of the present disclosure provide a display device. For example, the display device may be a self-luminous display device, such as an organic light-emitting diode (OLED) display device, or a quantum dot light-emitting diode (QLED) display device. In this case, the display device may include a display panel and a flexible printed circuit (FPC) bonded to the display panel. The display device may be any product or component having a display function, such as a display, a television, a digital camera, a mobile phone, or a tablet computer.

For example, the display device includes an OLED display panel with a common cathode. As shown in FIG. 1, The OLED display panel has a display area AA and a non-display area BM; and an integrated circuit (IC) is disposed in the non-display area BM. Anode power supply lines 401' in the OLED display panel are usually designed as a mesh structure, and are electrically connected to the IC through two anode power supply signal input terminals 201'. Anode power supply signals are input to the display area AA by the IC. A voltage drop from an end of an anode power supply line 401' proximate to the IC to an end of the anode power supply line 401' away from the IC is a vertical IR drop. That is, a voltage drop in a column direction of pixels is the vertical voltage drop IR drop. A voltage drop in a row direction of the pixels is a horizontal IR drop.

For the anode power supply lines 401', voltages at points B where the anode signals are input are the highest, and voltages at other positions are lower than the voltages at the points B where the anode signals are input due to the horizontal IR drop (the voltage drop) and/or the vertical IR drop.

Figure 2:
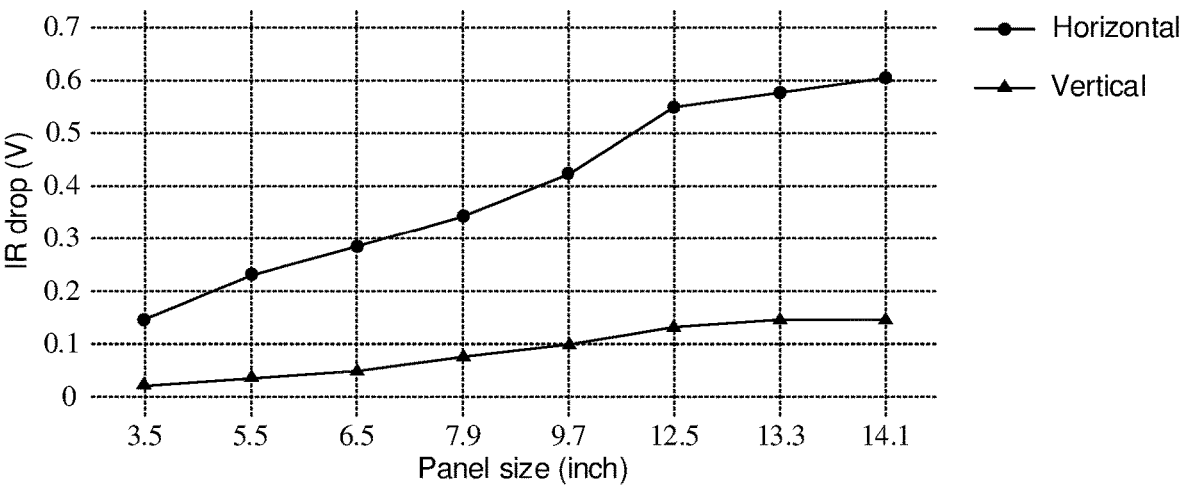
FIG. 2 is a diagram showing a relationship between an IR drop and a panel size in the related art.

As shown in FIG. 2, in display panels with different sizes, horizontal IR drops are all greater than the vertical IR drops, and as the size of the display panel increases, both the horizontal IR drop and the vertical IR drop rise.

For a micro light-emitting diode (micro LED) display panel or a mini light-emitting diode (mini LED) display panel, a magnitude of the pixel current is in a microampere (uA) level, which is about 1000 times of an OLED pixel current. Therefore, the micro LED display panel and the mini LED display panel have more serious horizontal IR drop than the OLED display panel.

Moreover, voltages Vds between sources and drains of driving thin film transistors at different positions in the display area AA of an array substrate in the display panel are different due to an effect of the IR drop. For a low temperature poly-silicon (LTPS) array substrate, properties of the thin film transistor are different at different voltages Vds, which will cause the difference in driving currents of light-emitting units, resulting in a problem of uneven display brightness.

Technical solutions of the present disclosure and how the technical solutions of the present disclosure solve the technical problem will be described in detail below with specific embodiments.

Figure 3:
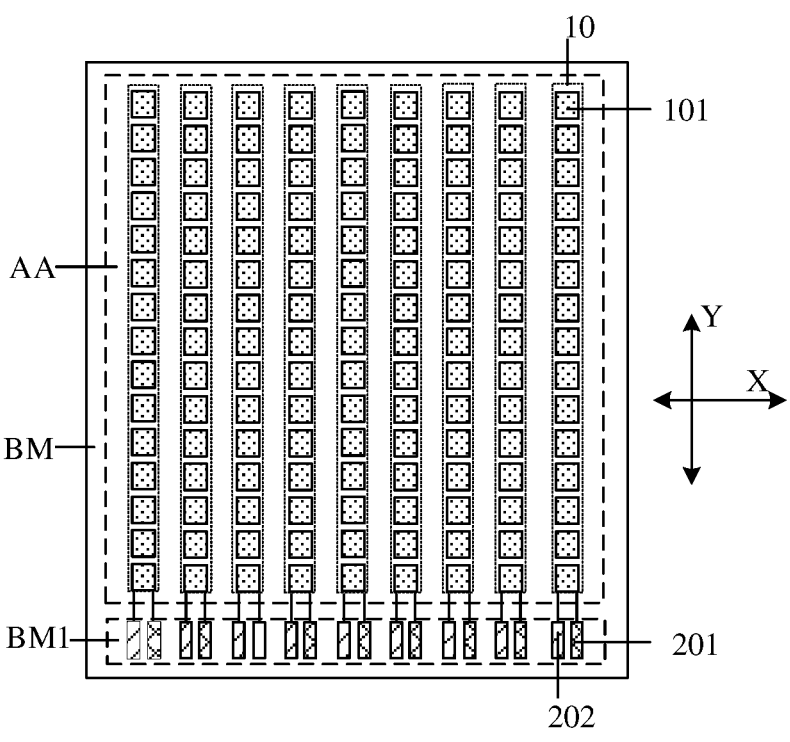
FIG. 3 is a diagram showing a structure of an array substrate, in accordance with some embodiments of the present disclosure.
Figure 4A:
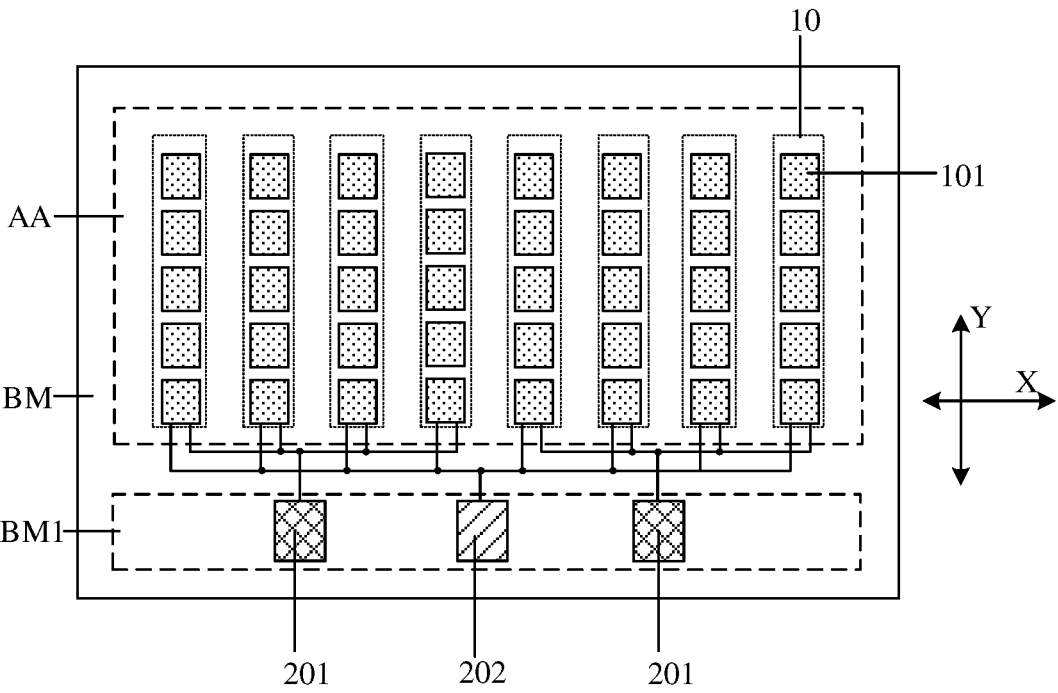
FIG. 4A is a diagram showing a structure of another array substrate, in accordance with some embodiments of the present disclosure.
Figure 4B:
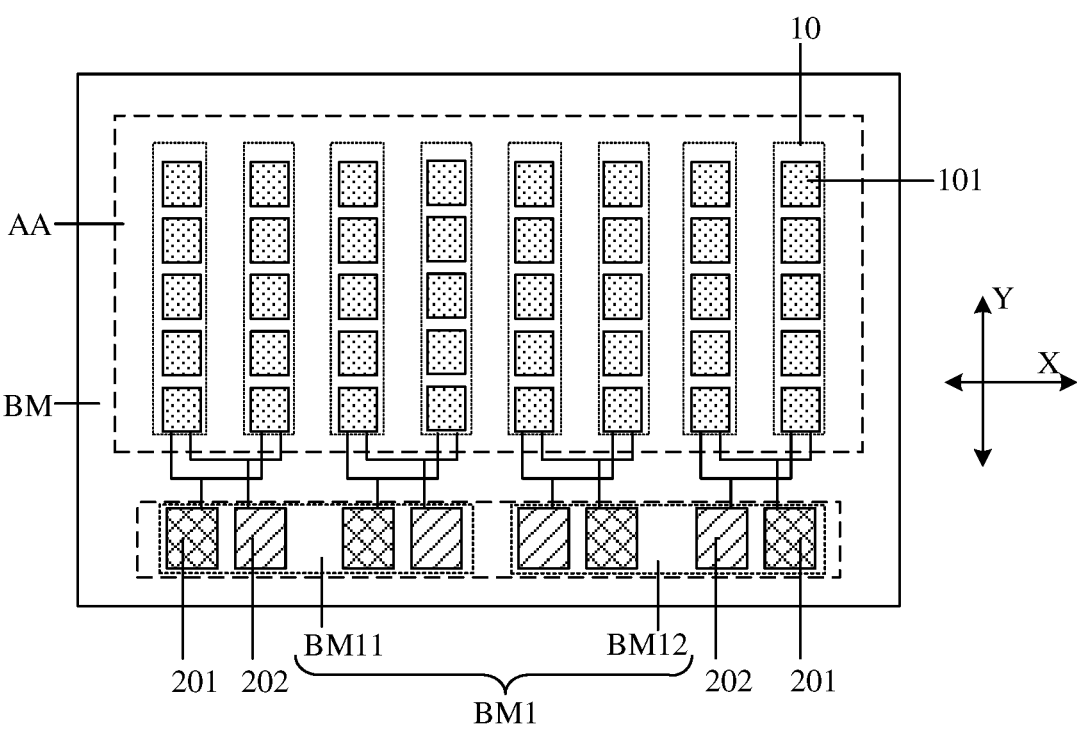
FIG. 4B is a diagram showing a structure of yet another array substrate, in accordance with some embodiments of the present disclosure.

Some embodiments of the present disclosure provide an array substrate. As shown in FIGS. 3, 4A and 4B, the array substrate has a display area AA and a non-display area BM. The non-display area BM includes a first bonding region BM1.

The array substrate includes a plurality of pixel columns 10 disposed in the display area AA, and at least two first power supply input terminals 201 disposed in the first bonding region BM1. Each first power supply input terminal 201 is connected to at least one of the plurality of pixel columns 10, so as to provide a first power supply signal to the at least one pixel column 10. Each of the plurality of pixel columns 10 includes a plurality of light-emitting units that are arranged in a second direction. For example, the second direction is perpendicular to a direction in which an edge of the display area AA proximate to the first bonding region BM1 extends. Pixel columns 10 connected to different first power supply input terminals 201 are different.

It will be noted that, the first power supply signal refers to the anode power supply signal. For example, the first power supply input terminal is a first power supply input pad or a first power supply input pattern.

In some embodiments, as shown in FIG. 3, each first power supply input terminal 201 is electrically connected to one pixel column 10 to provide the first power supply signal VDD to the pixel column 10. That is, the first power supply input terminals 201 are in one-to-one correspondence with the pixel columns 10. Therefore, the horizontal IR drop may be avoided, thereby significantly improving the uniformity of the display brightness.

In some other embodiments, as shown in FIGS. 4A and 4B, the first power supply input terminal 201 is electrically connected to at least two (two or more) pixel columns 10 to provide the first power supply signal VDD to the at least two pixel columns 10. That is, the first power supply input terminal 201 corresponds to multiple pixel columns 10 of the plurality of pixel columns 10. Therefore, it may effectively reduce the horizontal IR drop, so as to improve the uniformity of the display brightness, and may prevent a driving chip from being overloaded.

In some embodiments, as shown in FIGS. 5, and 6A to 6C, the non-display area BM further includes a fan-out region BM2. The fan-out region BM2 is located between the display area AA and the first bonding region BM1. The array substrate further includes at least two first fan-out structures 301 located in the fan-out region BM2. Each first power supply input terminal 201 is electrically connected to the at least one of the plurality of pixel columns 10 through one first fan-out structure 301. For example, resistances of the first fan-out structures 301 are equal.

Figure 5:
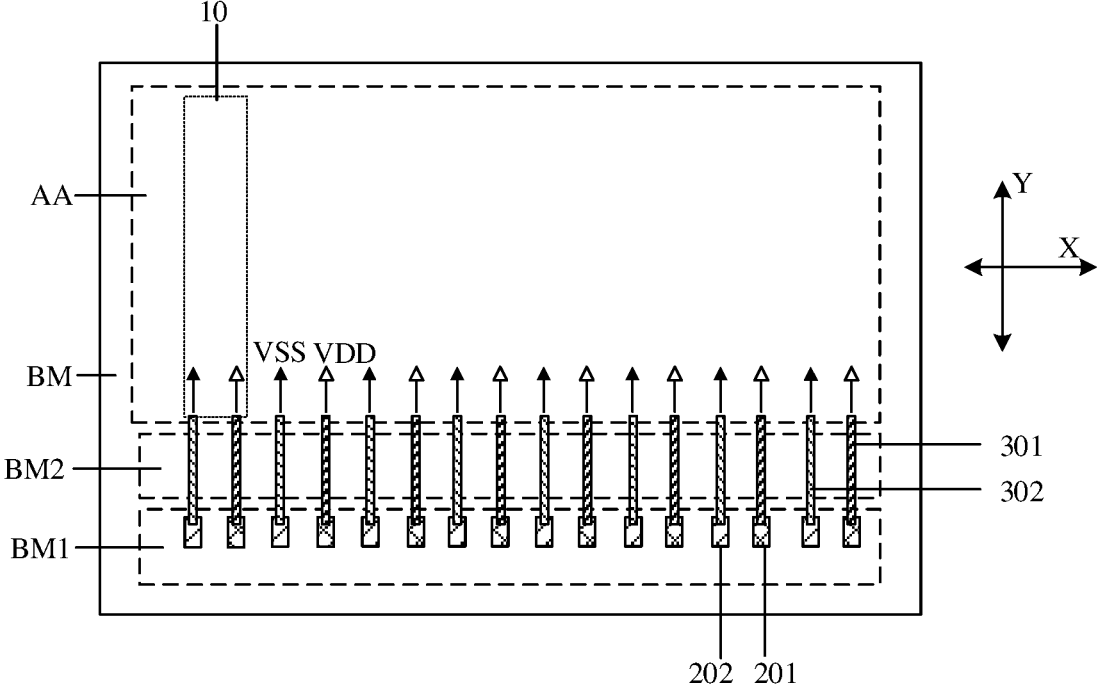
FIG. 5 is a schematic diagram showing a connection relationship between power supply input terminals and pixel columns, in accordance with some embodiments of the present disclosure.

For example, as shown in FIG. 5, each first power supply input terminal 201 is electrically connected to one pixel column 10 through one first fan-out structure 301 to provide the first power supply signal VDD to the pixel column 10.

As shown in FIG. 5, in the case where the first power supply input terminals 201 are in one-to-one correspondence with the pixel columns 10, there are many first fan-out structures 301 in the fan-out region BM2. Therefore, a width of each first fan-out structure 301 in a first direction X is small, the first direction X being perpendicular to the second direction Y, and the first fan-out structure 301 may be regarded as a conductive line, which transmits the first power supply signal output by the first power supply input terminal 201 to a corresponding pixel column.

Figure 6A:
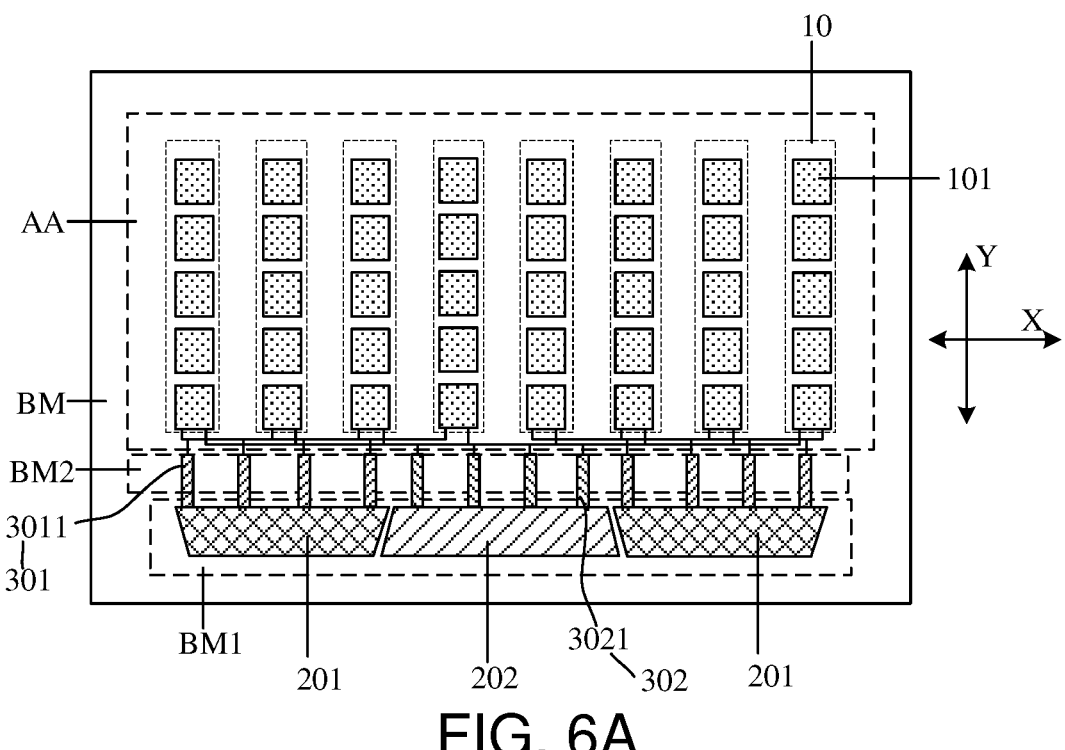
FIG. 6A is a diagram showing a structure of yet another array substrate, in accordance with some embodiments of the present disclosure.
Figure 6B:
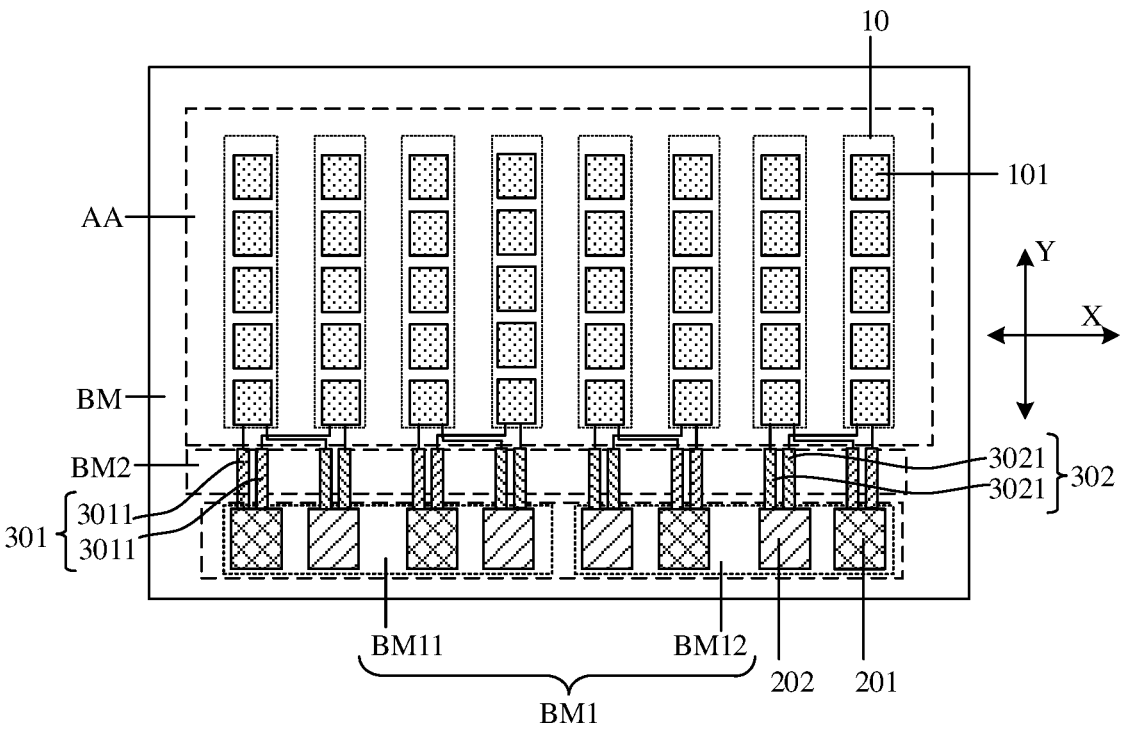
FIG. 6B is a diagram showing a structure of yet another array substrate, in accordance with some embodiments of the present disclosure.
Figure 6C:
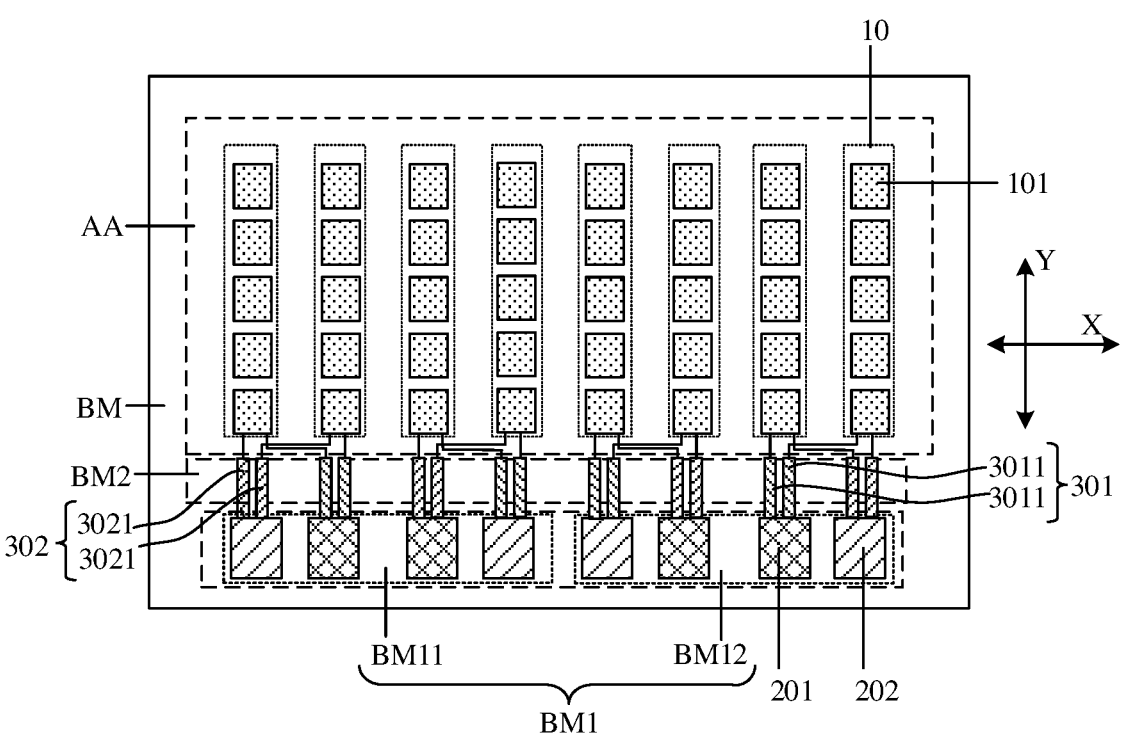
FIG. 6C is a diagram showing a structure of yet another array substrate, in accordance with some embodiments of the present disclosure.

For another example, as shown in FIGS. 6A to 6C, each first power supply input terminal 201 is electrically connected to the at least two (two or more) pixel columns 10 through one first fan-out structure 301 to provide the first power supply signal VDD to the at least two pixel columns 10.

As shown in FIGS. 6A to 6C, in the case where each first power supply input terminal 201 corresponds to the at least two (two or more) pixel columns 10, the width of the first fan-out structure 301 in the first direction X may be designed according to a width of the fan-out region BM2 in the first direction X and the number of the first fan-out structures 301.

In some embodiments, the resistances of the first fan-out structures 301 are equal. By setting the resistances of the first fan-out structures 301 in the fan-out region BM2 equal, anode power supply signals (i.e., first power supply signals VDD) are uniformly affected by the IR drop in the fan-out region BM2, which further reduces the effect of the IR drop on brightness of a display screen, thereby further improving the uniformity of the display brightness.

Figure 8:
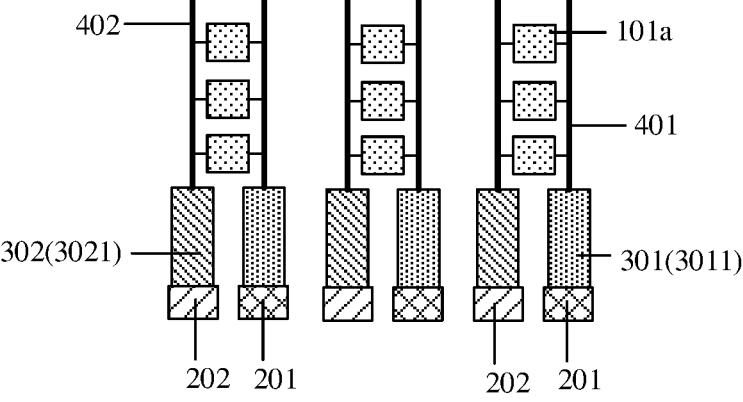
FIG. 8 is a diagram showing a partial structure of an array substrate using micro light-emitting diodes as light-emitting units, in accordance with some embodiments of the present disclosure.
Figure 10:
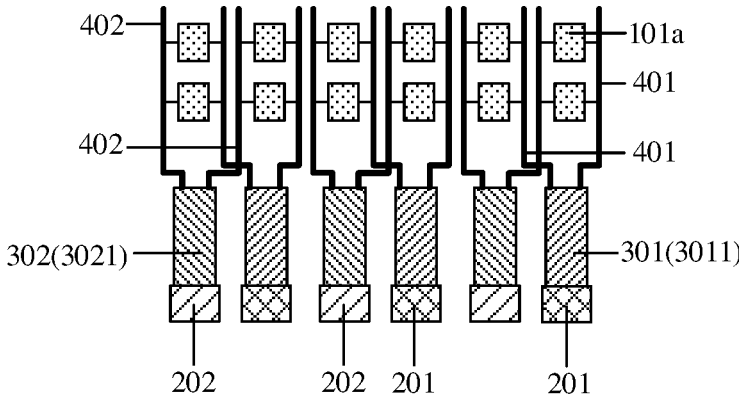
FIG. 10 is a diagram showing yet another partial structure of an array substrate using micro light-emitting diodes as light-emitting units, in accordance with some embodiments of the present disclosure.

In some embodiments, as shown in FIGS. 8 and 10, each first fan-out structure 301 includes one first conductive unit

3011, and each first conductive unit 3011 is electrically connected to at least one of the plurality of pixel columns 10.

For example, as shown in FIG. 8, the first fan-out structure 301 includes one first conductive unit 3011, and each first conductive unit 3011 is electrically connected to one pixel column. In this way, it may be possible to achieve that the first power supply input terminals 201 are in one-to-one correspondence with the pixel columns 10, which may avoid the horizontal IR drop, thereby significantly improving the uniformity of the display brightness.

For another example, as shown in FIG. 10, the first fan-out structure 301 includes one first conductive unit 3011, and each first conductive unit 3011 is electrically connected to at least two pixel columns 10. In this way, it may be possible to achieve that each first power supply input terminal 201 corresponds to multiple pixel columns 10. Therefore, it may effectively reduce the horizontal IR drop, so as to improve the uniformity of the display brightness, and may prevent the driving chip from being overloaded.

In some other embodiments, as shown in FIGS. 6A to 6C, 9 and 11, the first fan-out structure 301 includes a plurality of first conductive units 3011, and each of the plurality of first conductive units 3011 is electrically connected to at least one pixel column 10. In this way, each first power supply input terminal 201 corresponds to multiple pixel columns 10, it may not only effectively reduce the horizontal IR drop to improve the uniformity of the display brightness, and but also prevent the driving chip from being overloaded. Moreover, by providing the plurality of first conductive units 3011 in each first fan-out structure 301, it may avoid a problem that the first fan-out structure 301 is separated from a base caused by an excessively large area of the first fan-out structure 301.

Figure 9:
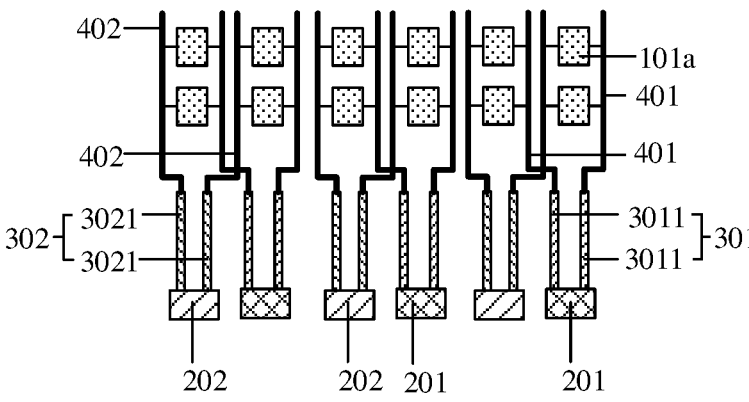
FIG. 9 is a diagram showing another partial structure of an array substrate using micro light-emitting diodes as light-emitting units, in accordance with some embodiments of the present disclosure.

For example, as shown in FIG. 9, each first fan-out structure 301 includes the plurality of first conductive units 3011, and each of the plurality of first conductive units 3011 is electrically connected to one pixel column 10.

Figure 11:
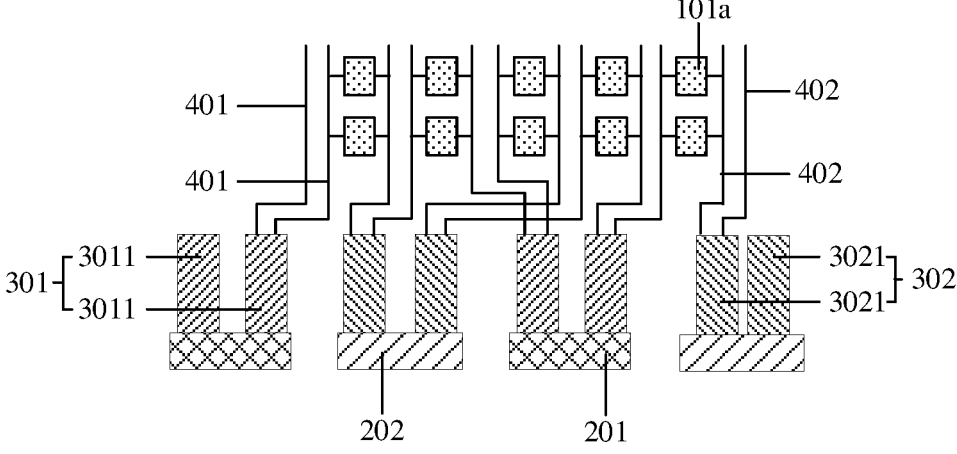
FIG. 11 is a diagram showing yet another partial structure of an array substrate using micro light-emitting diodes as light-emitting units, in accordance with some embodiments of the present disclosure.

For another example, as shown in FIG. 11, the first fan-out structure 301 includes the plurality of first conductive units 3011, and each of the plurality of first conductive units 3011 is electrically connected to at least two pixel columns 10. In this way, it is possible to achieve that each first power supply input terminal 201 corresponds to multiple pixel columns 10. Therefore, it may effectively reduce the horizontal IR drop, so as to improve the uniformity of the display brightness, and may prevent the driving chip from being overloaded. Moreover, by providing the plurality of first conductive units 3011 in each first fan-out structure 301, it may avoid the problem that the first fan-out structure 301 is separated from the base caused by the excessively large area of the first fan-out structure 301.

In some embodiments, as shown in FIGS. 6A to 6C, 9 and 11, the plurality of first conductive units 3011 of the first fan-out structure 301 are parallel to each other.

In some embodiments, as shown in FIGS. 6A to 6C, 9 and 11, the plurality of first conductive units 3011 of the first fan-out structure 301 are independently electrically connected to a corresponding first power supply input terminal 201.

In some embodiments, resistances of the plurality of first conductive units 3011 of the first fan-out structure 301 are substantially equal. In this way, it is possible to achieve equal resistance design for the first fanout structures 301.

In some embodiments, as shown in FIGS. 3, 4A and 4B, the array substrate further includes at least one second power supply input terminals 202 disposed in the first bonding region BM1, and each second power supply input terminal

202 is connected to at least one of the plurality of pixel columns 10 to provide a second power supply signal to the at least one pixel column 10. Pixel columns 10 connected to different second power supply input terminals 202 are different.

It will be noted that, the second power supply signal refers to a cathode power supply signal. For example, the second power supply input terminal is a second power supply input pad or a second power supply input pattern.

In some embodiments, as shown in FIG. 3, each second power supply input terminal 202 is electrically connected to one pixel column 10 to provide the second power supply signal VSS to the pixel column 10. That is, the second power supply input terminals 202 are in one-to-one correspondence with the pixel columns 10. Therefore, the horizontal IR drop may be avoided, thereby significantly improving the uniformity of the display brightness.

In some other embodiments, as shown in FIGS. 4A and 4B, each second power supply input terminal 202 is electrically connected to at least two (two or more) pixel columns 10 to provide the second power supply signal VSS to the at least two pixel column 10. In this way, it may effectively improve the poor uniformity of the display brightness caused by a large horizontal IR drop, and may prevent the driving chip from being overloaded, thereby improving the display quality.

In some embodiments, as shown in FIGS. 5 and 6A to 6C, the non-display area BM further includes the fan-out region BM2, and the fan-out region BM2 is located between the display area AA and the first bonding region BM1. The array substrate further includes at least one second fan-out structure 302 located in the fan-out region BM2. Each second power supply input terminal 202 is electrically connected to the at least one of the plurality of pixel columns 10 through one second fan-out structure 302.

In some embodiments, resistances of the second fan-out structures 302 are equal. By setting the resistances of the second fan-out structures 302 in the fan-out region BM2 equal, cathode power supply signals (i.e, second power supply signals VSS) are uniformly affected by the IR drop in the fan-out region BM2, which further reduces the effect of the IR drop on the brightness of the display screen, thereby further improving the uniformity of the display brightness.

For example, as shown in FIG. 5, each second power supply input terminal 202 is electrically connected to one pixel column 10 through one second fan-out structure 302 to provide the second power supply signal VSS to the pixel column 10.

As shown in FIG. 5, in a case where the second power supply input terminals 202 are in one-to-one correspondence with the pixel columns 10, there are many second fan-out structures 302 in the fan-out region BM2. Therefore, a width of each second fan-out structure 302 in the first direction X is small, and each second fan-out structure 302 may be regarded as a conductive line, which transmits the second power supply signal output by the second power supply input terminal 202 to a corresponding pixel column 10.

For another example, as shown in FIGS. 6A to 6C, each second power supply input terminal 202 is electrically connected to at least two (two or more) pixel columns 10 through one second fan-out structure 302 to provide the second power supply signal VSS to the at least two pixel columns 10.

As shown in FIGS. 6A to 6C, in a case where each second power supply input terminal 202 corresponds to the at least two pixel columns 10, the width of the second fan-out structure 302 in the first direction X may be designed according to the width of the fan-out region BM2 in the first direction X and the number of the second fan-out structures 302.

As shown in FIGS. 6A to 60, in the array substrate provided in some embodiments, the at least two first power supply input terminals 201 and the at least one second power supply input terminal 202 are alternately arranged in the first direction X. Correspondingly, the at least two first fan-out structures 301 and the at least one second fan-out structure 302 are alternately arranged in the first direction X. For example, as shown in FIG. 6A, the first power supply input terminal 201 is in a shape of an inverted trapezoid, and the second power supply input terminal 202 is in a shape of a positive trapezoid. For another example, the first power supply input terminal 201 is in a shape of a positive trapezoid, and the second power supply input terminal 202 is in a shape of an inverted trapezoid.

In the array substrate provided in some embodiments, the first fan-out structures 301 and the second fan-out structure(s) 302 are alternately arranged in the first direction X. In this way, the first fan-out structure 301 and the second fan-out structure 302 that respectively provide the first power supply signal VDD and the second power supply signal VSS to the same pixel column are adjacent, which facilitates the wiring from the fan-out region BM2 to the display area AA. Moreover, horizontal IR drops on which the first fan-out structure 301 and the second fan-out structure 302 are suffered may be equalized, which further reduces the effect of the horizontal IR drop on the uniformity of the display brightness, thereby improving the uniformity of the display brightness.

In some embodiments, as shown in FIGS. 8 and 10, each second fan-out structures 302 includes one second conductive unit 3021, and each second conductive unit 3021 is electrically connected to at least one of the plurality of pixel columns 10.

For example, as shown in FIG. 8, the second fan-out structure 302 includes one second conductive unit 3021, and each second conductive unit 3021 is electrically connected to one pixel column 10. In this way, it may be possible to achieve that the second power supply input terminals 202 are in one-to-one correspondence with the pixel columns 10, which may avoid the horizontal IR drop, thereby significantly improving the uniformity of the display brightness.

For another example, as shown in FIG. 10, each second fan-out structure 302 includes one second conductive unit 3021, and each second conductive unit 3021 is electrically connected to at least two (two or more) pixel columns 10. In this way, it may be possible to achieve that each second power supply input terminal 202 corresponds to multiple pixel columns 10. Therefore, it may effectively reduce the horizontal IR drop, so as to improve the uniformity of the display brightness, and may prevent the driving chip from being overloaded.

In some other embodiments, as shown in FIGS. 6A to 6C, 9 and 11, each second fan-out structure 302 includes a plurality of second conductive units 3021, and each second conductive unit 3021 is electrically connected to at least one pixel column 10. In this way, each second power supply input terminal 202 corresponds to multiple pixel columns 10, it may not only effectively reduce the horizontal IR drop to improve the uniformity of display brightness, but also prevent the driving chip from being overloaded. Moreover, by providing the plurality of second conductive units 3021 in each second fan-out structure 302, it may avoid the problem that the second fan-out structure 302 is separated from the base caused by the excessively large area of the second fan-out structure 302.

For example, as shown in FIG. 9, each second fan-out structure 302 includes the plurality of second conductive units 3021, and each of the plurality of second conductive units 3021 is electrically connected to one pixel column 10.

For another example, as shown in FIG. 11, the second fan-out structure 302 includes the plurality of second conductive units 3021, and each of the plurality of second conductive units 3021 is electrically connected to at least two pixel columns 10. In this way, it may be possible to achieve that each second power supply input terminal 202 corresponds to multiple pixel columns 10. Therefore, it may effectively reduce the horizontal IR drop, so as to improve the uniformity of display brightness, and may prevent the driving chip from being overloaded. Moreover, by providing the plurality of second conductive units 3021 in each second fan-out structure 302, it may avoid the problem that the second fan-out structure 302 is separated from the base caused by the excessively large area of the second fan-out structure 302.

In order to prevent the fan-out structure (e.g., the first fan-out structure 301 or the second fan-out structure 302) from being separated from the base due to an excessive width of the fan-out structure in the first direction X, the fan-out structure may be designed as a structure including a plurality of conductive units, the conductive units in the same fan-out structure are electrically connected to the same first power supply input terminal 201 or the same second power supply input terminal 202, and each conductive unit provides the first power supply signal VDD or the second power supply signal VSS to one or more pixel columns. In addition, the fan-out structure may be partially hollowed out. For example, the fan-out structure is designed as a mesh structure to prevent the fan-out structure from being separated from the base.

It will be noted that, the base refers to a layer located under the fan-out structure and in contact with the fan-out structure, which is usually made of an insulating material.

In some embodiments, as shown in FIGS. 6A to 60, 9 and 11, the plurality of second conductive units 3021 in the second fan-out structure 302 are parallel to each other.

In some embodiments, as shown in FIGS. 6A to 60, 9 and 11, the plurality of second conductive units 3021 in the second fan-out structure 302 are independently electrically connected to a corresponding second power supply input terminal 202.

In some embodiments, resistances of the plurality of second conductive units 3021 in the second fan-out structure 302 are substantially equal. In this way, it is possible to achieve equal resistance design for the second fanout structures 302.

In some embodiments, as shown in FIGS. 4B, 6B and 6C, the first bonding region BM1 includes a first bonding sub-region BM11 and a second bonding sub-region BM12 arranged in the first direction X. The at least two first power supply input terminals 201 are divided into two sets of first power supply input terminals 201, each set of first power supply input terminals 201 includes two or more first power supply input terminals 201, and the two sets of first power supply input terminals 201 are located in the first bonding sub-region BM11 and the second bonding sub-region BM12, respectively. The at least one second power supply input terminal 202 includes a plurality of second power supply input terminals 202 that are divided into two sets of second power supply input terminals 202, each set of second power supply input terminals 202 includes two or more second power supply input terminals 202, and the two sets of second power supply input terminals 202 are located in the first bonding sub-region BM11 and the second bonding sub-region BM12, respectively.

Since each set of first power supply input terminals 201 includes at least two first power supply input terminals 201, and each set of second power supply input terminals 202 includes at least two second power supply input terminals 202, the total number of first power supply input terminals 201 and the total number of second power supply input terminals 202 are both greater than or equal to 4. In this way, by setting the number and corresponding size of the first power supply input terminals 201 and the second power supply input terminals 202, the array substrate provided in the embodiments of the present disclosure may be applied to more products.

In some embodiments, as shown in FIGS. 4B, 6B and 6C, first power supply input terminals 201 and second power supply input terminals 202 located in the first bonding sub-region BM11 as a whole is mirrored symmetrically with first power supply input terminals 201 and second power supply input terminals 202 located in the second bonding sub-region BM12 as a whole. In this way, it can ensure consistency in brightness on both sides of the display screen.

In some implementations, as shown in FIGS. 4B and 6B, the first power supply input terminals 201 and second power supply input terminals 202 located in the first bonding sub-region BM11 are alternately arranged in the first direction X. Correspondingly, the first power supply input terminals 201 and second power supply input terminals 202 located in the second bonding sub-region BM12 are also alternately arranged in the first direction X. In this way, it can ensure the uniformity of the display brightness.

In some implementations, as shown in FIG. 6C, first power supply input terminals 201 located in the first bonding sub-region BM11 are adjacent to each other, and second power supply input terminals 202 located in the first bonding sub-region BM11 are separated by the first power input terminals 201.

Figure 6D:
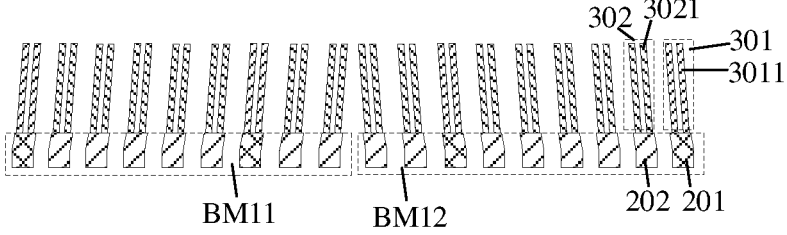
FIG. 6D is a diagram showing an arrangement of power supply input terminals and connections between the power supply input terminals and conductive units of fan-out structures.

In some implementations, as shown in FIG. 6D, for part of first power supply input terminals 201 located in the first bonding sub-region BM11, at least two second power supply input terminals 202 are disposed between two adjacent first power supply input terminals 201. Correspondingly, for part of first power supply input terminals 201 located in the second bonding sub-region BM12, at least two second power supply input terminals 202 are disposed between two adjacent first power supply input terminals 201.

In some embodiments, the light-emitting unit may be a micro LED or a mini LED. That is, the array substrate is a micro LED array substrate or a mini LED array substrate. The light-emitting unit may also be an OLED. That is, the array substrate is an OLED array substrate. Array substrates with two types of light-emitting units will be described in detail below.

In some embodiments, the light-emitting unit includes a first electrode and a second electrode. Each anode line is electrically connected to first electrodes of light-emitting units included in at least one of the plurality of pixel columns.

Figure 7:
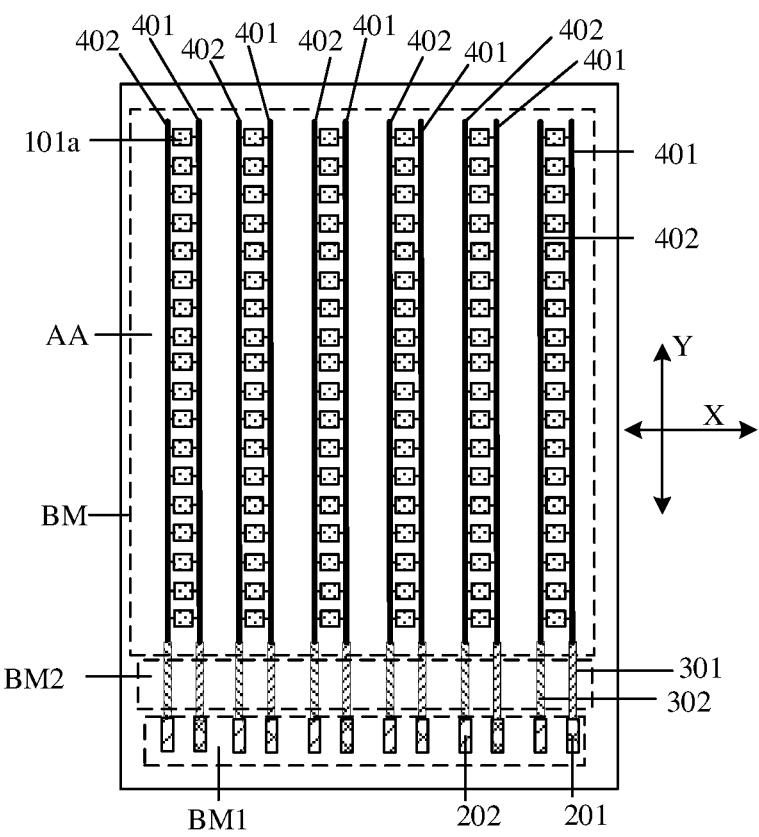
FIG. 7 is a diagram showing a structure of an array substrate using micro light-emitting diodes as light-emitting units, in accordance with some embodiments of the present disclosure.

For example, as shown in FIG. 7, the light-emitting unit 101 is the micro LED 101a, and the micro LED 101a includes the first electrode and the second electrode. The array substrate includes a plurality of anode lines 401 and a plurality of cathode lines 402 that are located in the display area AA. Each anode line 401 is electrically connected to first electrodes of micro LEDs 101a included in a corresponding pixel column, and each cathode line 402 is electrically connected to second electrodes of the micro LEDs 101a included in a corresponding pixel column.

For another example, the light-emitting unit 101 is the micro LED 101a. Each anode line 401 is electrically connected to first electrodes of micro LEDs 101a included in at least two (two or more) pixel columns of the plurality of pixel columns. Each cathode line 402 is electrically connected to second electrodes of the micro LEDs 101a included in the at least two (two or more) pixel columns of the plurality of pixel columns.

In some embodiments, the first fan-out structure 301 is electrically connected to at least one anode line 401, and the second fan-out structure 302 is electrically connected to at least one cathode line 402. For example, as shown in FIG. 8, the first fan-out structure 301 is electrically connected to one anode line 401, and the second fan-out structure 302 is electrically connected to at least one cathode line 402. For another example, as shown in FIG. 10, the first fan-out structure 301 is electrically connected to multiple (at least two) anode lines 401, and the second fan-out structure 302 is electrically connected to multiple (at least two) cathode lines 402.

In a case where the array substrate is the micro LED array substrate or the mini LED array substrate, in order to reduce the horizontal IR drop, a corresponding relationship between the power supply input terminals and the pixel columns may be designed according to specific conditions. A driving current of the micro LED or the mini LED is large, thus an effect of reducing the horizontal IR drop is obvious. Therefore, the effect of improving the uniformity of the display brightness is significant.

Figure 12:
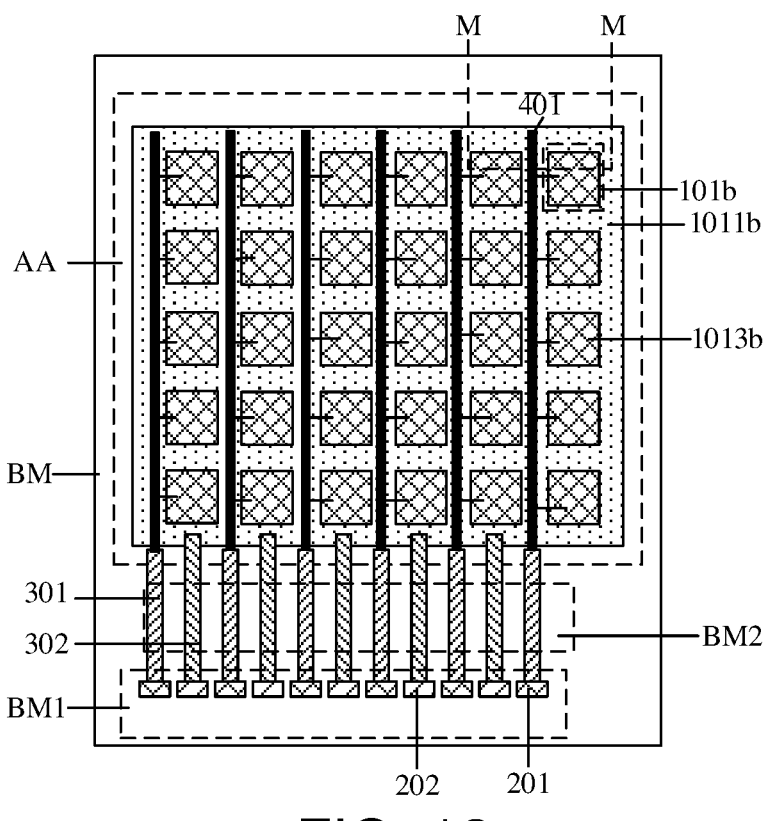
FIG. 12 is a top view showing a structure of an array substrate using organic light-emitting diodes as light-emitting units, in accordance with some embodiments of the present disclosure.
Figure 13:
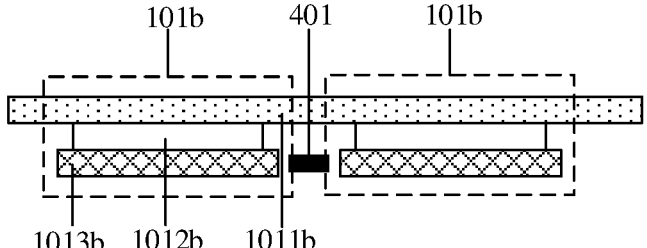
FIG. 13 is a sectional view showing a partial structure of the array substrate shown in FIG. 12 taken along the line M-M.

For example, as shown in FIGS. 12 and 13, the light-emitting unit 101 is the OLED 101b, and the OLED 101b includes a first electrode, a second electrode and an organic light-emitting layer; the first electrode of the OLED 101b is an anode unit 1013b, and the second electrode of the OLED 101b is a portion of a cathode layer 1011b; and each organic light-emitting layer 1012b is located between the cathode layer 1011b and a corresponding anode unit 1013b. The array substrate further includes a plurality of anode lines 401. The anode line 401 is electrically connected to anode units 1013b of OLEDs 101b included in at least one of the plurality of pixel columns, the first power supply input terminal 201 is electrically connected to at least one anode line 401 through the first fan-out structure 301, and the second power supply input terminal 202 is electrically connected to the cathode layer 1011b through the second fan-out structure 302.

It will be noted that, a relative position of the anode lines 401 and the anode units 1013b in FIG. 12 is only taken as an exemplary illustration. In practical applications, the anode lines 401 and the anode units 1013b may be arranged in the same layer. The anode lines 401 and the anode units 1013b may also be located in different layers, and are connected through via holes.

Figure 14:
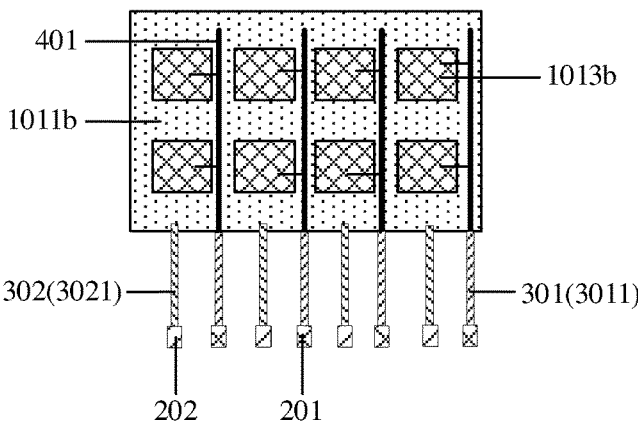
FIG. 14 is a diagram showing a partial structure of an array substrate using organic light-emitting diodes as light-emitting units, in accordance with some embodiments of the present disclosure.

In some embodiments, as shown in FIG. 14, the first fan-out structure 301 includes one first conductive unit 3011, and each first conductive unit 3011 is electrically connected to one anode line 401. The second fan-out structure 302 includes one second conductive unit 3021, and each second conductive unit 3021 is electrically connected to the cathode layer 1011b. In this way, it is possible to achieve that the first power supply input terminals 201 are in one-to-one correspondence with the pixel columns. As a result, the horizontal IR drop may be avoided, thereby significantly improving the uniformity of the display brightness.

Figure 15:
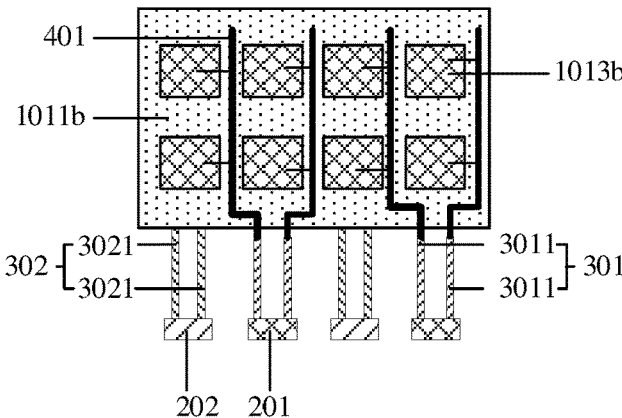
FIG. 15 is a diagram showing another partial structure of an array substrate using organic light-emitting diodes as light-emitting units, in accordance with some embodiments of the present disclosure.

In some other embodiments, as shown in FIG. 15, the first fan-out structure 301 includes the plurality of first conductive units 3011, and each of the plurality of first conductive units 3011 is electrically connected to one anode line 401. The second fan-out structure 302 includes the plurality of second conductive units 3021, and each of the plurality of second conductive units 3021 is electrically connected to the cathode layer 1011*b*. In this way, it is possible to achieve that each first power supply input terminal 201 corresponds to pixel columns. As a result, it may effectively reduce the horizontal IR drop, so as to improve the uniformity of the display brightness, and may prevent the driving chip from being overloaded. Moreover, by providing the plurality of conductive units in each fan-out structure, it may avoid the problem that the fan-out structure is separated from the base caused by the excessively large area of the fan-out structure.

Figure 16:
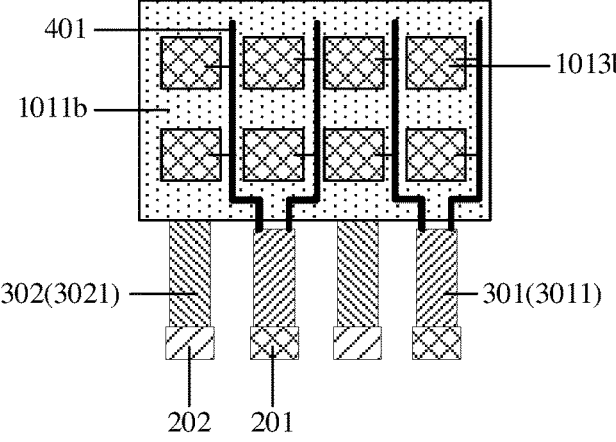
FIG. 16 is a diagram showing yet another partial structure of an array substrate using organic light-emitting diodes as light-emitting units, in accordance with some embodiments of the present disclosure.

In yet some other embodiments, as shown in FIG. 16, the first fan-out structure 301 includes one first conductive unit 3011, and each first conductive unit 3011 is electrically connected to anode lines 401. The second fan-out structure 302 includes one second conductive unit 3021, and each second conductive unit 3021 is electrically connected to the cathode layer 1011*b*. In this way, it is possible to achieve that each first power supply input terminal 201 corresponds to pixel columns.

Figure 17:
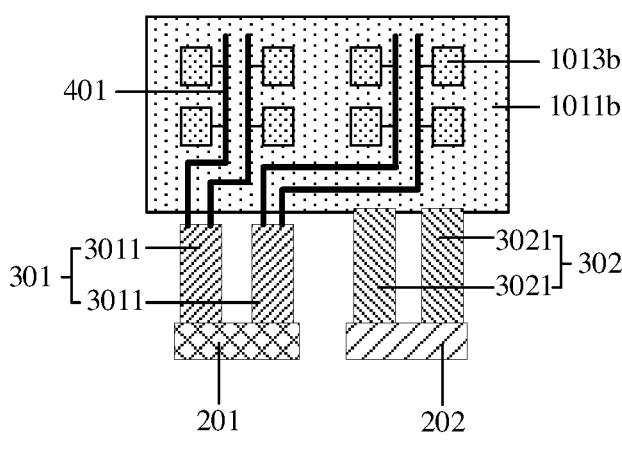
FIG. 17 is a diagram showing yet another partial structure of an array substrate using organic light-emitting diodes as light-emitting units, in accordance with some embodiments of the present disclosure.

In yet some other embodiments, as shown in FIG. 17, the first fan-out structure 301 includes the plurality of first conductive units 3011, and each first conductive unit 3011 is electrically connected to anode lines 401. The second fan-out structure 302 includes one or more second conductive units 3021, and each second conductive unit 3021 is electrically connected to the cathode layer 1011*b*. In this way, it is possible to achieve that each first power supply input terminal 201 corresponds to pixel columns. As a result, it may effectively reduce the horizontal IR drop, so as to improve the uniformity of the display brightness, and may prevent the driving chip from being overloaded. Moreover, by providing the plurality of conductive units in each fan-out structure, it may avoid the problem that the fan-out structure is separated from the base caused by the excessively large area of the fan-out structure.

Figure 18:
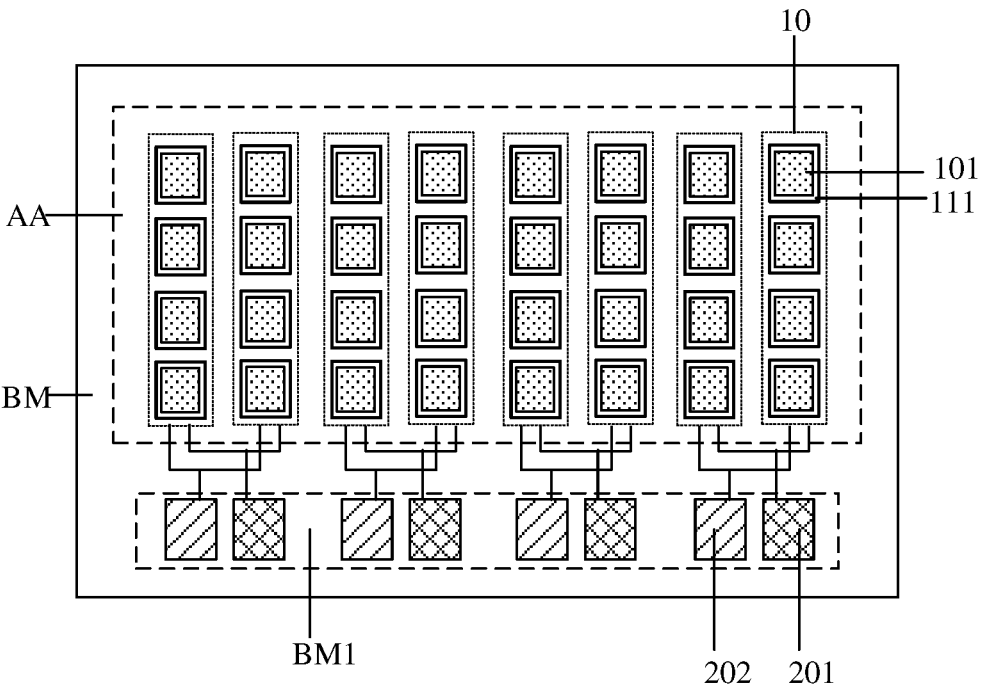
FIG. 18 is a schematic diagram showing a structure of yet another array substrate, in accordance with some embodiments of the present disclosure.

In some embodiments, as shown in FIG. 18, the array substrate further includes pixel circuits 111 arranged in an array, and each pixel circuit 111 is electrically connected to a corresponding light-emitting unit 101, and is configured to provide a driving signal to the corresponding light-emitting unit 101. The light-emitting unit includes the first electrode and the second electrode, and each pixel circuit is electrically connected to the first electrode of the corresponding light-emitting unit. Each first power supply input terminal 201 is electrically connected to pixel circuits 111 that are electrically connected to light-emitting units 101 included in at least one of the plurality of pixel columns 10, so as to provide the first power supply signal to the pixel circuits 111 that are electrically connected to the first power supply input terminal 201; and each second power supply input terminal 202 is electrically connected to second electrodes of light-emitting units 101 included in at least one of the plurality of pixel columns 10, so as to provide the second power supply signal to the second electrodes of the light-emitting units 101 included in the at least one of the plurality of pixel columns 10.

For example, in a case where the light-emitting unit 101 is the micro LED 101*a*, the micro LED 101*a* includes the first electrode and the second electrode. The pixel circuit is electrically connected to the first electrode of a corresponding micro LED 101*a*. Each first power supply input terminal 201 provides the first power supply signal VDD to pixel circuits in one or more of the plurality of pixel columns, and each second power supply input terminal 202 provides the second power supply signal VSS to second electrodes of micro LEDs included in one or more of the plurality of pixel columns.

For another example, in a case where the light-emitting unit 101 is the OLED 101*b*, the OLED 101*b* includes the first electrode (i.e., the anode unit 1013*b*) and the second electrode (i.e., the portion of the cathode layer 1011*b*). The pixel circuit is electrically connected to the anode of a corresponding OLED 101*b*. Each first power supply input terminal 201 provides the first power supply signal VDD to pixel circuits in one or more of the plurality of pixel columns, and each second power supply input terminal 202 provides the second power supply signal VSS to cathodes of OLEDs included in one or more of the plurality of pixel columns.

Figure 19:
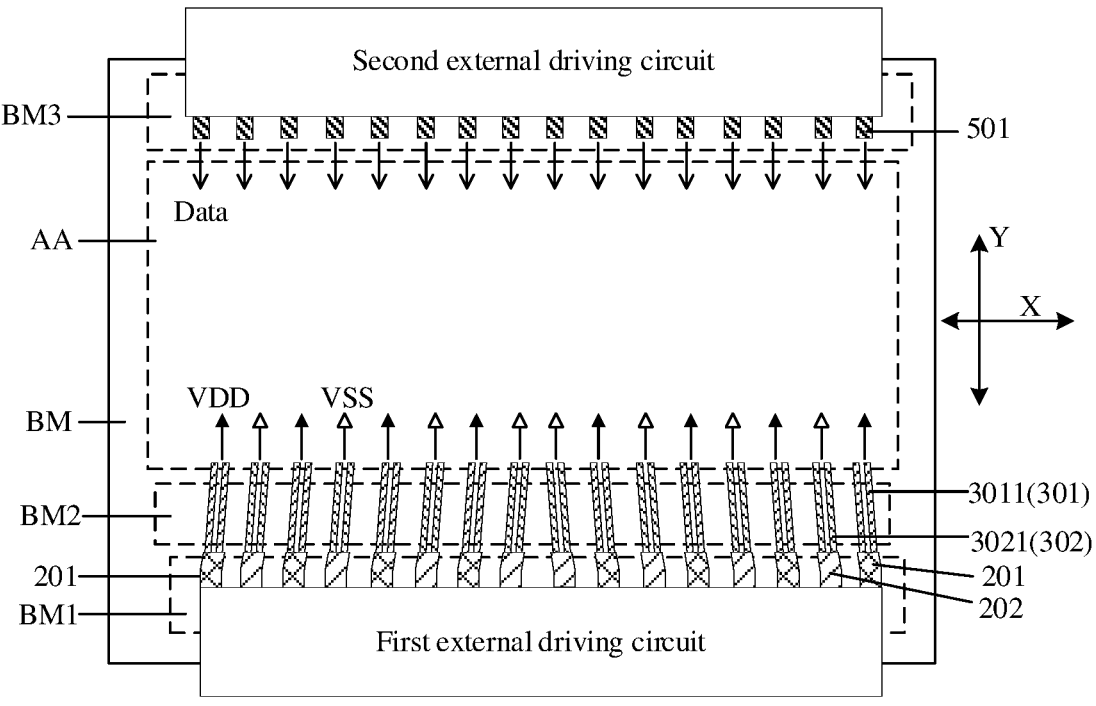
FIG. 19 is a schematic diagram showing a structure of yet another array substrate, in accordance with some embodiments of the present disclosure.

In some embodiments, as shown in FIG. 19, the non-display area BM further includes a second bonding region BM3 located on a side of the display area AA away from the first bonding region BM1 in the second direction Y. The array substrate further includes a plurality of data signal input terminals 501 located in the second bonding region BM3, and the plurality of data signal input terminals 501 are configured to provide data signals to the light-emitting units.

In the embodiments, the data signal input terminals 501 and the power supply signal input terminals (i.e., the first power supply signal input terminals 201 and the second power supply signal input terminals 202) are arranged on opposite sides of the display area AA, which may prevent interferences between the data signals and the power supply signals, and reduce wiring difficulty.

Figure 20:
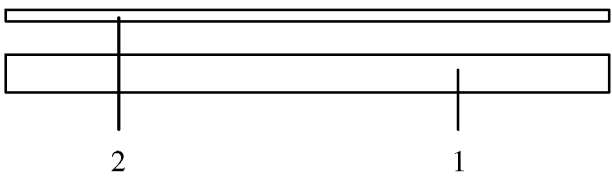
FIG. 20 is a diagram showing a structure of a display panel, in accordance with some embodiments of the present disclosure.

Based on the same inventive concept, some embodiments provide a display panel. As shown in FIG. 20, the display panel includes the array substrate 1 as described in the above embodiments. The display panel has the beneficial effects of the array substrate in the embodiments, which will not be repeated here.

In some embodiments, as shown in FIG. 20, the display panel in the embodiments further includes a cover plate 2.

Figure 21:
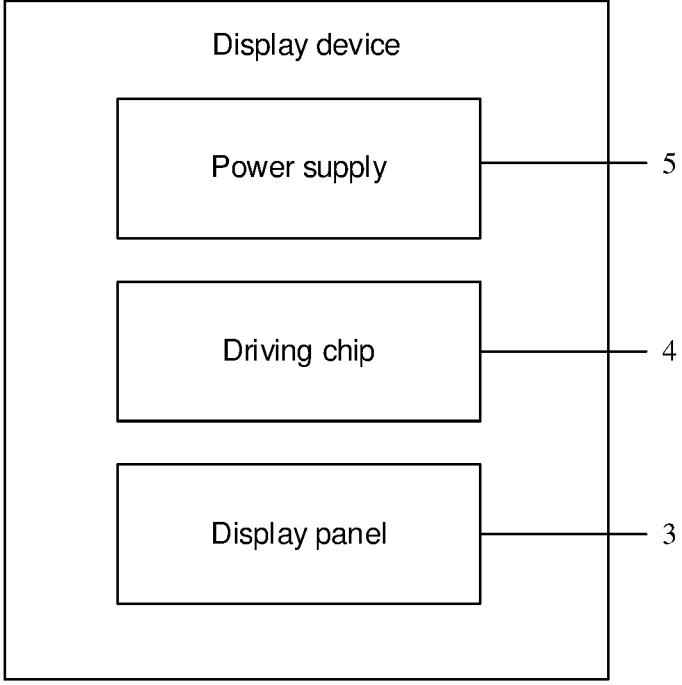
FIG. 21 is a diagram showing a structure of a display device, in accordance with some embodiments of the present disclosure.

Some embodiments of the present disclosure provide a display device. As shown in FIG. 21, the display device includes the display panel 3 as described in the above embodiments. The display device has the beneficial effects of the display panel in the embodiments, which will not be repeated here.

In some embodiments, the display device provided in the embodiments further includes driving chip(s) 4 and a power supply 5. In a case where the non-display area of the array substrate includes the first bonding region and the second bonding region disposed at the opposite sides of the display area, the driving chip(s) 4 include a first driving chip and a second driving chip. The first driving chip is bonded to the first bonding region and is electrically connected to the power supply 5. The power supply 5 provides the first power supply signals to the first power supply input terminals and the second power supply signals to the second power supply input terminals under the driving of the first driving chip. The second driving chip is bonded to the second bonding region to provide the data signals to the array substrate.

In some embodiments, as shown in FIG. 19, in a case where the non-display area BM of the array substrate includes the first bonding region BM1 and the second bonding region BM3, the display device further includes a first external driving circuit bonded to the first bonding region BM1, and a second external driving circuit bonded to the second bonding region BM3.

For example, the first external driving circuit and the second external driving circuit may be driving chips. That is, the two driving chips are directly bonded to the first bonding region and the second bonding region. For another example, the first external driving circuit and the second external driving circuit may each include a flexible circuit board and a driving chip, the driving chip is bonded to the flexible circuit board, and the flexible circuit board is bonded to the first bonding region or the second bonding region.

The foregoing descriptions are merely specific implementations of the present disclosure, but the protection scope of the present disclosure is not limited thereto. Any person skilled in the art could conceive of changes or replacements within the technical scope of the present disclosure, which shall be included in the protection scope of the present disclosure. Therefore, the protection scope of the present disclosure shall be subject to the protection scope of the claims.

What is claimed is:

1. An array substrate having a display area and a non-display area, the non-display area including a first bonding region and a fan-out region located between the display area and the first bonding region, the array substrate comprising:

a plurality of pixel columns disposed in the display area, each of the plurality of pixel columns including a plurality of light-emitting units;

at least two first power supply input terminals disposed in the first bonding region, each first power supply input terminal being connected to multiple pixel columns of the plurality of pixel columns, so as to provide a first power supply signal to the multiple pixel columns, the first power supply signal being an anode power supply signal;

at least two first fan-out structures disposed in the fan-out region, each first power supply input terminal being electrically connected to the multiple pixel columns of the plurality of pixel columns through one first fan-out structure, each first fan-out structure being configured to transmit the first power supply signal;

at least one second power supply input terminal disposed in the first bonding region, wherein each second power supply input terminal is electrically connected to at least one pixel column of the plurality of pixel columns, so as to provide a second power supply signal to the at least one pixel column connected to the second power supply input terminal, and the second power supply signal is a cathode power supply signal; and at least one second fan-out structure disposed in the fan-out region, wherein each second power supply input terminal is electrically connected to another multiple pixel columns of the plurality of pixel columns through one second fan-out structure, and each second fan-out structure is configured to transmit the second power supply signal, wherein each first fan-out structure includes a plurality of first conductive units, and each first conductive unit is electrically connected to at least one of the plurality of pixel columns; and each second fan-out structure includes a plurality of second conductive units, and each second conductive unit is electrically connected to at least one of the plurality of pixel columns.

2. The array substrate according to claim 1, wherein the plurality of first conductive units are parallel to each other.

3. The array substrate according to claim 1, wherein the plurality of first conductive units of each first fan-out structure are independently electrically connected to a corresponding first power supply input terminal.

4. The array substrate according to claim 1, wherein resistances of the plurality of first conductive units are substantially equal.

5. The array substrate according to claim 1, wherein each first conductive unit is electrically connected to one pixel column, and each second conductive unit is electrically connected to one pixel column.

6. The array substrate according to claim 1, wherein the plurality of second conductive units are parallel to each other; and/or resistances of the plurality of second conductive units are substantially equal; and/or the plurality of second conductive units of each second fan-out structure are independently electrically connected to a corresponding second power supply input terminal.

7. The array substrate according to claim 1, wherein the at least two first power supply input terminals and the at least one second power supply input terminal are alternately arranged in a first direction, the first direction being perpendicular to an extending direction of the pixel column.

8. The array substrate according to claim 1, wherein the first bonding region includes a first bonding sub-region and a second bonding sub-region arranged in a first direction, the first direction being perpendicular to an extending direction of the pixel column;

the at least two first power supply input terminals are divided into two sets of first power supply input terminals, each set of first power supply input terminals includes two or more first power supply input terminals, and the two sets of first power supply input terminals are located in the first bonding sub-region and the second bonding sub-region, respectively; and the at least one second power supply input terminal includes a plurality of second power supply input terminals that are divided into two sets of second power supply input terminals, each set of second power supply input terminals includes two or more second power supply input terminals, and the two sets of second power supply input terminals are located in the first bonding sub-region and the second bonding sub-region, respectively.

9. The array substrate according to claim 8, wherein first power supply input terminals and second power supply input terminals located in the first bonding sub-region as a whole is mirrored symmetrically with first power supply input terminals and second power supply input terminals located in the second bonding sub-region as a whole.

10. The array substrate according to claim 9, wherein the first power supply input terminals and second power supply input terminals located in the first bonding sub-region are alternately arranged in the first direction.

11. The array substrate according to claim 9, wherein for part of first power supply input terminals located in the first bonding sub-region, at least two second power supply input terminals are disposed between two adjacent first power supply input terminals.

12. The array substrate according to claim 9, wherein first power supply input terminals located in the first bonding sub-region are adjacent to each other, and second power supply input terminals located in the first bonding sub-region are separated by the first power input terminals.

13. The array substrate according to claim 1, wherein the plurality of light-emitting units each include a first electrode;

the array substrate further comprises pixel circuits arranged in an array, and each pixel circuit is electrically connected to a first electrode of a corresponding light-emitting unit, and is configured to provide a driving signal to the corresponding light-emitting unit; and each first power supply input terminal is electrically connected to pixel circuits that are electrically connected to light-emitting units included in the multiple pixel columns of the plurality of pixel columns, so as to provide the first power supply signal to the pixel circuits that are electrically connected to the first power supply input terminal.

14. The array substrate according to claim 13, wherein the light-emitting unit further includes a second electrode;

each second power supply input terminal is electrically connected to second electrodes of light-emitting units included in the at least one pixel column of the plurality of pixel columns, so as to provide the second power supply signal to the second electrodes of the light-emitting units included in the at least one pixel column of the plurality of pixel columns.

15. The array substrate according to claim 1, wherein the non-display area further includes a second bonding region located on a side of the display area away from the first bonding region; and the array substrate further comprises a plurality of data signal input terminals located in the second bonding region, and the plurality of data signal input terminals are configured to provide data signals to light-emitting units.

16. A display panel, comprising the array substrate according to claim 1.

17. A display device, comprising the display panel according to claim 16.

18. The display device according to claim 17, wherein the non-display area of the array substrate includes the first bonding region and a second bonding region, the second bonding region is located on a side of the display area away from the first bonding region; and the display device further comprises a first external driving circuit bonded to the first bonding region and a second external driving circuit bonded to the second bonding region.

\* \* \* \* \*